(12) United States Patent
Huang

(10) Patent No.: US 8,426,307 B2
(45) Date of Patent: *Apr. 23, 2013

(54) REDUCING RESISTIVITY IN INTERCONNECT STRUCTURES OF INTEGRATED CIRCUITS

(75) Inventor: Cheng-Lin Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 79 days.

This patent is subject to a terminal disclaimer.

(21) Appl. No.: 13/036,599

(22) Filed: Feb. 28, 2011

(65) Prior Publication Data

US 2011/0171826 A1  Jul. 14, 2011

Related U.S. Application Data

(63) Continuation of application No. 12/690,796, filed on Jan. 20, 2010, now Pat. No. 7,956,465, which is a continuation-in-part of application No. 11/429,879, filed on May 8, 2006, now Pat. No. 7,919,862.

(51) Int. Cl.
*H01L 21/4763* (2006.01)

(52) U.S. Cl.
USPC ........... 438/627; 438/643; 438/624; 257/751; 257/767

(58) Field of Classification Search ............ 438/624, 438/627, 643, 648; 257/751, 758, 767, E23.161, 257/E23.16

See application file for complete search history.

(56) References Cited

U.S. PATENT DOCUMENTS

| | | | |
|---|---|---|---|
| 5,130,274 | A | 7/1992 | Harper et al. |
| 5,659,201 | A | 8/1997 | Wollesen |
| 6,211,075 | B1 | 4/2001 | Liu et al. |
| 6,294,832 | B1 | 9/2001 | Yeh et al. |
| 6,420,189 | B1 | 7/2002 | Lopatin |
| 6,433,379 | B1 | 8/2002 | Lopatin et al. |
| 6,465,867 | B1 | 10/2002 | Bernard et al. |
| 6,589,329 | B1 | 7/2003 | Baum et al. |
| 6,713,373 | B1 | 3/2004 | Omstead |
| 6,803,310 | B2 | 10/2004 | Wang et al. |
| 6,846,739 | B1 | 1/2005 | Cathey et al. |
| 6,936,535 | B2 | 8/2005 | Kim et al. |
| 6,951,812 | B2 | 10/2005 | Jiang et al. |
| 6,958,547 | B2 | 10/2005 | Dubin et al. |
| 7,008,872 | B2 | 3/2006 | Dubin et al. |

(Continued)

FOREIGN PATENT DOCUMENTS

| CN | 1185033 A | 6/1998 |
|---|---|---|
| CN | 1438691 A | 8/2003 |

(Continued)

OTHER PUBLICATIONS

Prater, W.L., et al., "Reduction of Resistivity in Cu Thin Films by Partial Oxidation: Microstructural Mechanisms", Applied Physics Letters, vol. 84, No. 14, Apr. 5, 2004, pp. 2518-2520.

*Primary Examiner* — Tucker Wright
(74) *Attorney, Agent, or Firm* — Slater & Matsil, L.L.P.

(57) ABSTRACT

An integrated circuit structure having improved resistivity and a method for forming the same are provided. The integrated circuit structure includes a dielectric layer, an opening in the dielectric layer, an oxide-based barrier layer directly on sidewalls of the opening, and conductive materials filling the remaining portion of the opening.

20 Claims, 8 Drawing Sheets

U.S. PATENT DOCUMENTS

| | | |
|---|---|---|
| 7,037,836 B2 | 5/2006 | Lee |
| 7,179,759 B2 | 2/2007 | Huang et al. |
| 7,612,451 B2 * | 11/2009 | Shih et al. ............... 257/751 |
| 7,919,862 B2 * | 4/2011 | Huang ..................... 257/751 |
| 2001/0031539 A1 | 10/2001 | Uhlenbrock et al. |
| 2002/0009880 A1 | 1/2002 | Jiang et al. |
| 2002/0022334 A1 | 2/2002 | Yang et al. |
| 2002/0024139 A1 | 2/2002 | Chan et al. |
| 2003/0183940 A1 | 10/2003 | Noguchi et al. |
| 2003/0207560 A1 | 11/2003 | Dubin et al. |
| 2003/0207561 A1 | 11/2003 | Dubin et al. |
| 2004/0043333 A1 | 3/2004 | Keller |
| 2004/0147115 A1 | 7/2004 | Goundar et al. |
| 2006/0019485 A1 | 1/2006 | Komai et al. |
| 2007/0161128 A1 | 7/2007 | Ueno |
| 2007/0257369 A1 | 11/2007 | Huang et al. |
| 2008/0012133 A1 | 1/2008 | Shih et al. |
| 2008/0286965 A1 | 11/2008 | Lee et al. |
| 2010/0171220 A1 | 7/2010 | Huang |

FOREIGN PATENT DOCUMENTS

| | | |
|---|---|---|
| CN | 1623228 A | 6/2005 |
| CN | 1755914 A | 4/2006 |
| JP | 2000-252285 A | 9/2000 |
| KR | 2004/0064977 A | 7/2004 |

* cited by examiner

REDUCING RESISTIVITY IN INTERCONNECT STRUCTURES OF INTEGRATED CIRCUITS

This application is a continuation of prior U.S. patent application Ser. No. 12/690,796, filed Jan. 20, 2010 now U.S. Pat. No. 7,956,465, entitled "Reducing Resistivity in Interconnect Structures of Integrated Circuits," which is a continuation-in-part of prior U.S. patent application Ser. No. 11/429,879, filed on May 8, 2006 now U.S. Pat. No. 7,919,862, entitled "Reducing Resistivity in Interconnect Structures of Integrated Circuits;" these applications are hereby incorporated herein by reference in their entireties.

CROSS-REFERENCE TO RELATED APPLICATION

This application is related to the commonly assigned U.S. patent application Ser. No. 11/486,893, filed Jul. 13, 2006, entitled "Reducing Resistivity in Interconnect Structures by Forming an Inter-Layer," which application is incorporated herein by reference.

TECHNICAL FIELD

This invention relates generally to integrated circuits, and more particularly to the structure and formation methods of interconnect structures of integrated circuits.

BACKGROUND

In the manufacture of integrated circuits, after the individual devices such as the transistors have been fabricated on the semiconductor substrate, they must be interconnected in order to perform the desired circuit functions. This interconnection process is generally called "metallization" and is performed using a number of different photolithographic, deposition, and removal techniques.

A commonly used process for forming interconnect structures is referred to as a "damascene" process. In a typical damascene process, dielectric layers are deposited over the devices, followed by the formation of openings in the dielectric layers. Conductive materials are then deposited in the openings. A polish process is used to planarize the conductive materials with the surfaces of the respective dielectric layers so as to cause the conductive materials to be "inlaid" in the respective dielectric layers.

Copper is typically used for the damascene processes. Copper has low resistivity, thus the RC delay caused by the resistance in the interconnect structure is low. However, with the scaling of the integrated circuits, the dimensions of copper interconnects are also down-scaled. When the dimensions of the copper interconnects approach the mean free path of electrons, the resistivity of the interconnect structure significantly increases. As a result, the RC delay from the interconnect structure significantly increases.

Various methods have been explored to reduce the resistivities of the interconnect structures. For example, diffusion barrier layers, which are used to prevent copper from diffusing into neighboring low-k dielectric layers, typically have high resistivities. Methods for forming thinner barrier layers are thus used. Also, the scattering of electrons at the boundaries of the copper grains contributes to the increase of the resistivity, and thus various methods have been proposed to increase the copper grain size, hence reducing the scattering of electrons at the grain boundaries.

With the constant reduction in the size of the interconnect structures, methods for lowering resistivity are always demanded. Particularly, as the dimensions of interconnect structures become smaller and smaller, phenomena that used to be insignificant begin to contribute more to the overall resistivity. Accordingly, new methods adjusting for these factors are needed.

SUMMARY

In accordance with one aspect of the present invention, an integrated circuit structure includes a dielectric layer, an opening in the dielectric layer, an oxide-based barrier layer directly on sidewalls of the opening, and conductive materials filling the remaining portion of the opening.

In accordance with another aspect of the present invention, a damascene interconnect structure includes a dielectric layer, a copper line in the dielectric layer and an oxide-based metal compound layer between the copper line and the dielectric layer, wherein the oxide-based metal compound layer adjoins the copper line and the dielectric layer.

In accordance with yet another aspect of the present invention, a method for forming an integrated circuit structure includes providing a dielectric layer, forming an opening in the dielectric layer, forming an oxide-based barrier layer in the opening, and filling a conductive material in the opening to form an interconnect structure.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
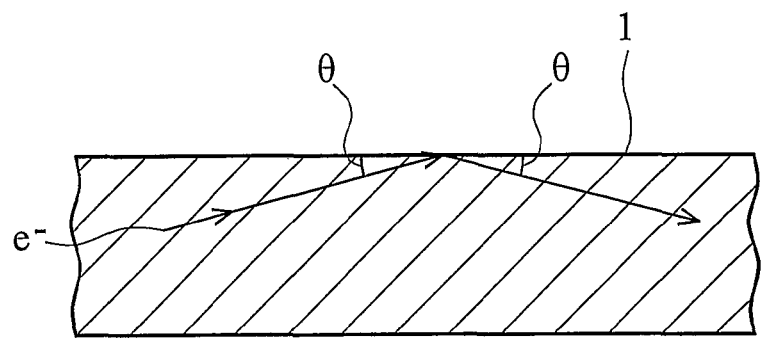
FIG. 1A illustrates an elastic scattering of an electron at a surface of a metal line.
Figure 1B:
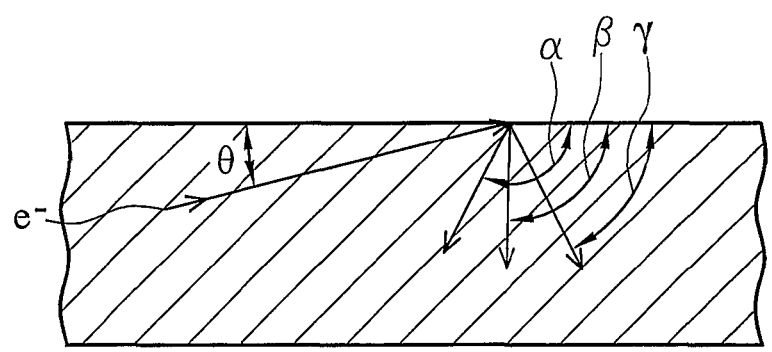
FIG. 1B illustrates a diffusion scattering of an electron at a surface of a metal line.

Electrons flowing in a metal line scatter when they meet the surfaces, or interfaces, between the metal line and the enclosing materials. The scattering behavior of electrons varies according to the type of enclosing material. FIGS. 1A and 1B illustrate two scattering behaviors. FIG. 1A illustrates an elastic scattering. Electrons hitting a surface 1 at an angle θ are elastically bounced at a substantially same angle θ. Therefore, the mobility of the electrons is substantially not changed. A scattering factor P can be defined as 1 for an elastic scattering. FIG. 1B schematically illustrates diffuse scatterings, wherein an electron hitting the surface 1 at a small angle θ may be scattered at a greater angle α, β, or γ. Therefore, the mobility of the electron is reduced. The scattering factor P is less than 1 for a diffuse scattering.

Non-elastic scattering causes surface-scattering-induced resistivity. The Fuchs-Sondheimer model and the Dingle model both predict that a surface-scattering-induced resistivity is related to the scattering factor P. A greater scattering factor P results in a smaller surface-scattering-induced resistivity, hence the overall resistivity of the metal line is smaller. Conversely, a smaller scattering factor P results in a greater surface-scattering-induced resistivity, hence the overall resistivity of the metal line is greater. Therefore, it can be derived that if the surface of a conductor provides a more elastic scattering for electrons, the surface-scattering-induced resistivity and the overall resistivity will be reduced.

It has been found that an electron has a more elastic scattering when the enclosing material comprises metal oxide. Accordingly, an interconnect structure having a greater scattering factor and a method for forming the same are provided. The intermediate stages of manufacturing a preferred embodiment of the present invention are illustrated. The variations of the preferred embodiments are then discussed. Throughout the various views and illustrative embodiments of the present invention, like reference numbers are used to designate like elements.

Figure 2:
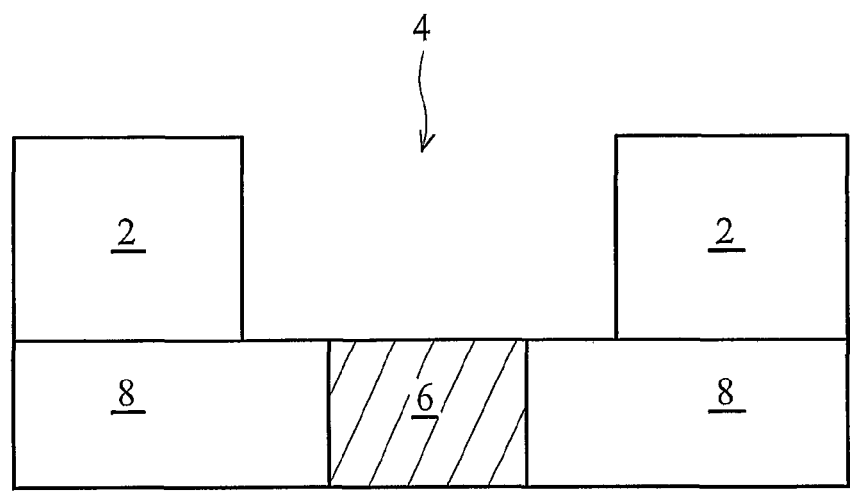
FIGS. 2 through 7 are cross-sectional views of intermediate stages in the manufacture of a preferred embodiment.

FIGS. 2 through 7 illustrate a preferred embodiment of the present invention, wherein a single damascene process is discussed. By slightly changing the formation process, however, the solution provided by the preferred embodiment of the present invention can be applied to dual damascene processes. FIG. 2 illustrates the formation of an opening 4 in a dielectric layer 2. Dielectric layer 2 and an underlying dielectric layer 8 are preferably formed over a substrate (not shown), and may be an inter-layer dielectric (ILD) layer or an inter-metal dielectric (IMD) layer. In the preferred embodiment, dielectric layer 2 has a low dielectric constant (k value), wherein the k value is preferably less than about 3.5. The preferred formation methods include spin-on, chemical vapor deposition (CVD), plasma enhanced CVD (PECVD), atomic layer deposition (ALD), sub-atmospheric CVD (SACVD), low pressure CVD (LPCVD), and other known deposition techniques. A conductive feature 6 formed in dielectric layer 8 is schematically shown to illustrate how the subsequently formed metal line is connected to other conductive features. Conductive feature 6 may be a contact plug, a via or a metal line.

Depending on where the opening 4 is located in the interconnect structure, opening 4 may be a trench opening or some other opening for forming a metal feature, such as a via opening, a contact opening, and the like. Preferably, opening 4 is formed by etching dielectric layer 2.

Figure 3:
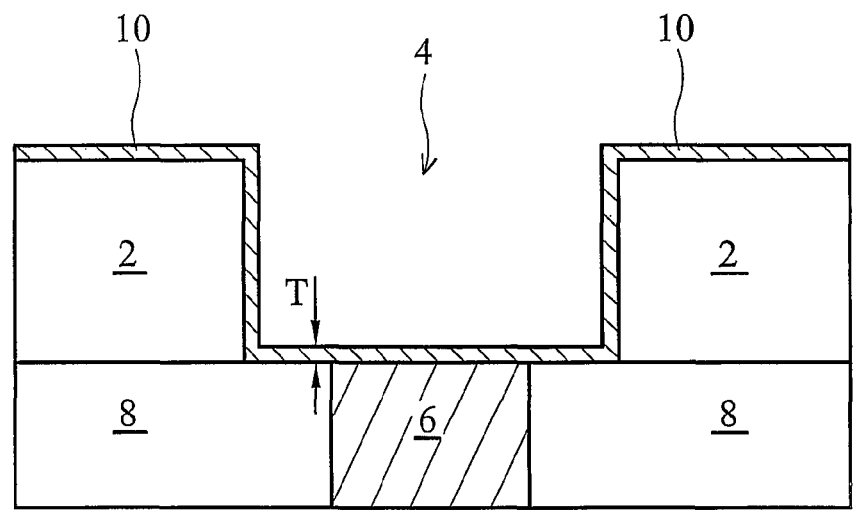

FIG. 3 illustrates the formation of an (diffusion) oxide-based barrier layer 10 covering the sidewalls and the bottom of the opening 4. Preferably, the thickness T of the barrier layer 10 is less than about 300 Å, and more preferably between about 5 Å and 100 Å.

In the preferred embodiment, barrier layer 10 is deposited on the dielectric layer 2 and in opening 4. The preferred materials include copper oxide, tantalum oxide, titanium oxide, tungsten oxide, ruthenium oxide, rhodium oxide, cobalt oxide, manganese oxide and combinations thereof. The preferred deposition methods include CVD, ALD, low temperature CVD (LTCVD), LPCVD, PVD, and the like. In an exemplary embodiment, barrier layer 10 comprises tantalum oxide, and is formed using PVD. The preferred process conditions include a chamber pressure of about 0.5 mtorr, and process gases containing argon, oxygen and nitrogen. The deposition is preferably performed at a temperature of about −80° C. to about 450° C. In other embodiments, a thin metal layer is deposited, and the metal layer is then oxidized in an oxygen-containing ambient, which preferably includes molecular components such as $O_2$, $O_3$, $N_2O$, $NO_2$, NO, and combinations thereof.

In yet other embodiments, barrier layer 10 comprises oxynitrides such as copper oxynitride, tantalum oxynitride, titanium oxynitride, tungsten oxynitride, ruthenium oxynitride, rhodium oxynitride, cobalt oxynitride, manganese oxynitride, and combinations thereof. Similarly, barrier layer 10 may be deposited in an environment containing both nitrogen and oxygen using commonly used methods such as CVD, PECVD, LPCVD, PVD, ALD, and the like. Alternatively, oxynitride barrier layer 10 may be deposited by depositing a thin metal layer, and then nitridating and oxidizing the surface of the thin metal layer in an environment containing both nitrogen and oxygen.

Figure 4:
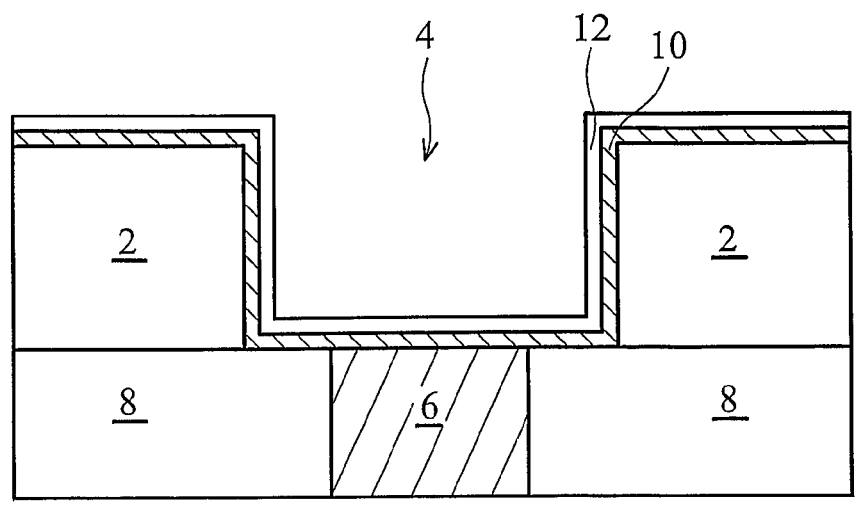

Optionally, a copper oxide layer 12 is further formed on the barrier layer 10 if the barrier layer 10 is not a copper oxide layer. The resulting structure is shown in FIG. 4. Copper oxide layer 12 may be deposited using PVD, CVD, ALD, and the like. Alternatively, copper oxide layer 12 can be formed by forming a thin copper layer and in-situ oxidizing the copper layer. The thickness of the copper oxide layer 12 is preferably less than about 300 Å.

Figure 5:
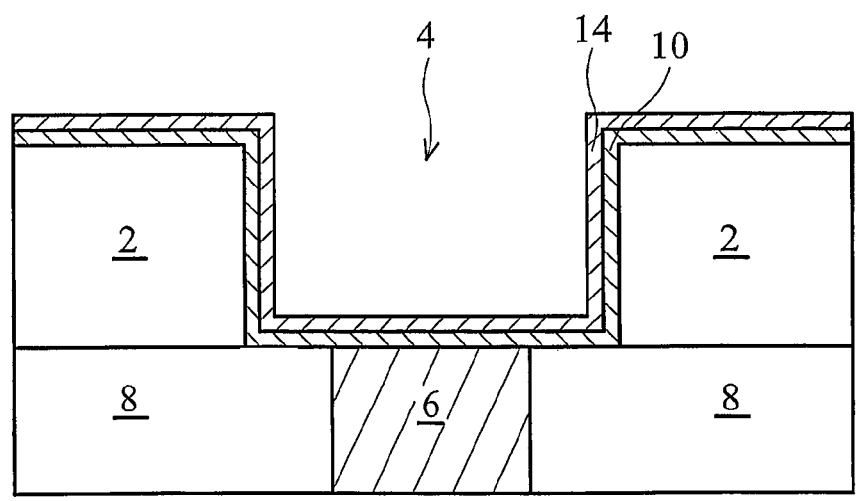

Referring to FIG. 5, a copper seed layer 14 is formed. Depending on the structure formed in previous steps, copper seed layer 14 may be formed on barrier layer 10 or the optional copper oxide layer 12. As is known in the art, copper seed layer 14 may be formed by PVD, ALD, CVD, or other commonly known methods.

Figure 6:
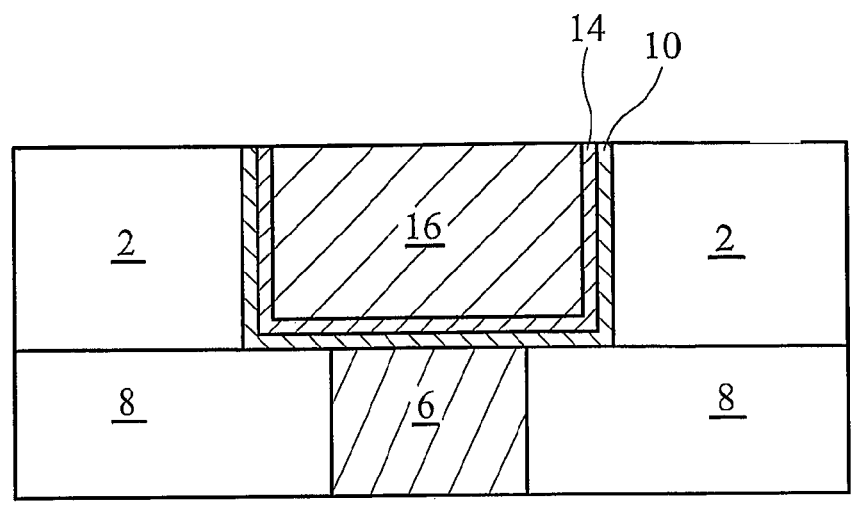

FIG. 6 illustrates the formation of a metal line 16 in opening 4. Metal line 16 preferably comprises copper or copper alloys. However, other metals such as aluminum, silver, tungsten, and/or other well-known alternatives, can also be used. The preferred formation methods include electro or electroless plating, although other commonly used methods can also be used. A chemical mechanical planarization (CMP), also sometimes referred to as a chemical mechanical polish, is performed to remove excess material.

Figure 7:
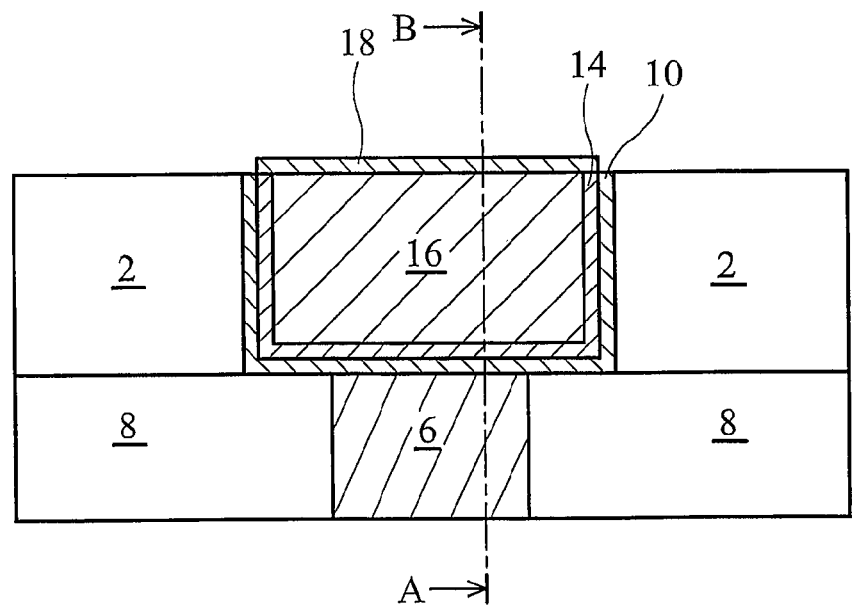

FIG. 7 illustrates an oxide-based cap layer 18 formed on the metal line 16. In the preferred embodiment, oxide-based cap layer 18 is formed by oxidizing metal line 16 and an exposed portion of the seed layer 14 in an oxygen-containing environment. In alternative embodiments, an oxide-based metal compound may be deposited on metal line 16 to form the cap layer 18. Oxide-based cap layer 18 preferably comprises copper oxide, tantalum oxide, titanium oxide, tungsten oxide, copper oxynitride, tantalum oxynitride, titanium oxynitride, tungsten oxynitride, ruthenium oxynitride, rhodium oxynitride, and combinations thereof.

Figure 8:
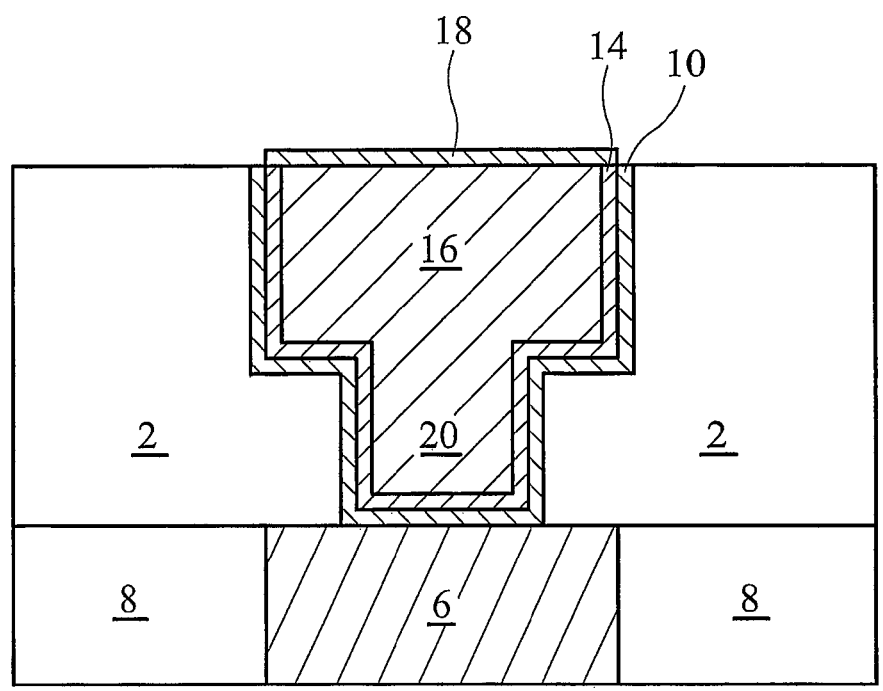
FIG. 8 illustrates a variation of the preferred embodiment having a dual damascene structure.

The above-discussed embodiment illustrates a single damascene process. One skilled in the art will realize that a dual damascene process may also be performed with the teaching of the preferred embodiment to form a dual damascene structure as shown in FIG. 8, which comprises a metal line 16 connected to a via 20. One skilled in the art will also realize the materials and process steps for forming the structure by identifying the like reference numerals and comparing them with the previously discussed embodiment.

It is noted that an oxide-based material 10 exists between two conductive features 6 and 16. The resistance of oxide-based material 10 thus affects the resistance of the corresponding interconnect structure. An experiment has been conducted to form a first via chain including 10,000 vias connected in series, wherein each of the vias has the structure shown in FIG. 8.

Figure 9:
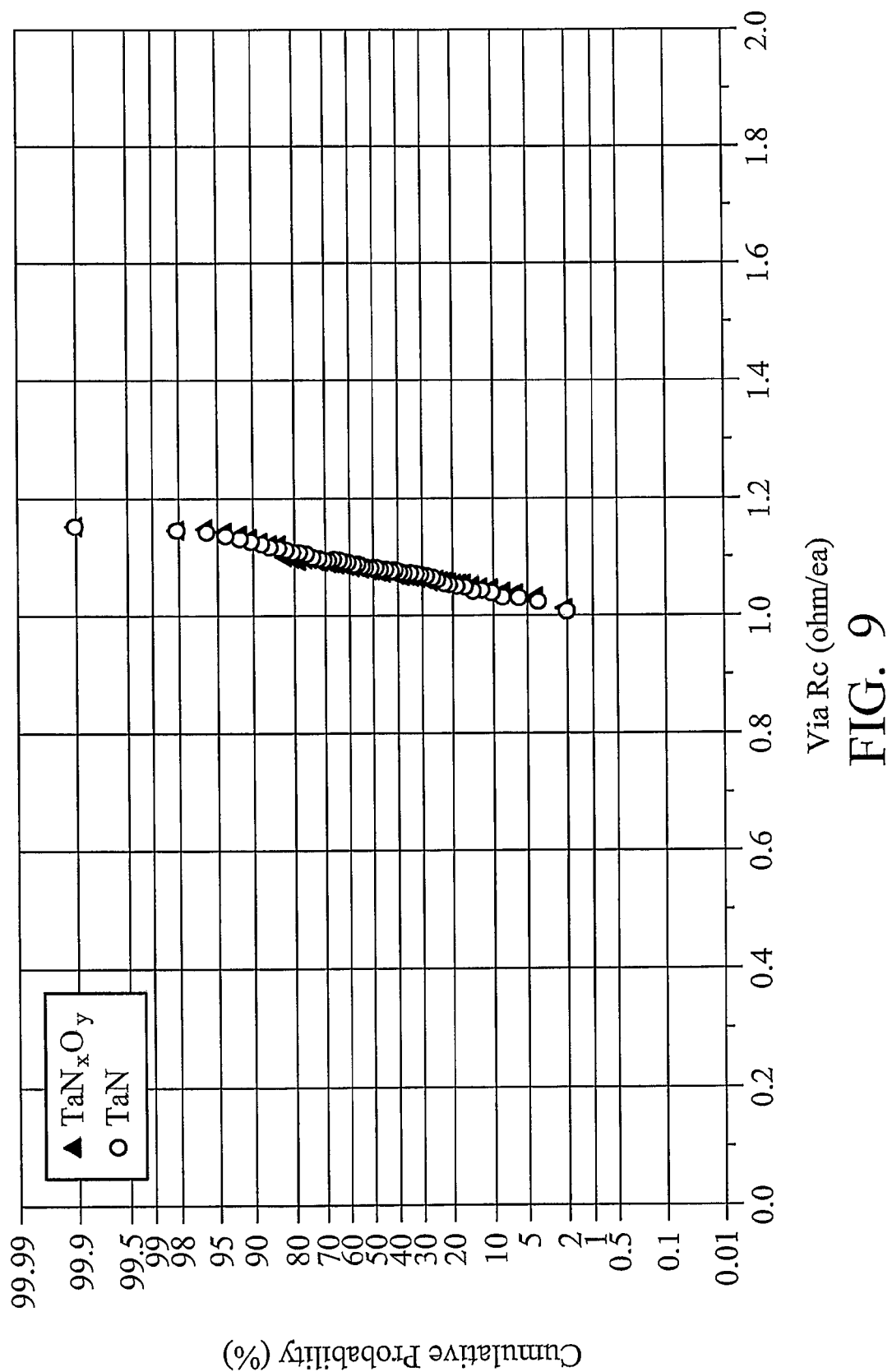
FIG. 9 illustrates the cumulative probability of vias having resistances greater than a certain value.

The experiment results are shown as solid triangles in FIG. 9, wherein the x-axis shows the resistance of vias, and the y-axis shows the cumulative probability of vias having resistances greater than a certain value. Each of the vias includes an oxide-based barrier layer comprising $TaN_xO_y$, wherein x is about 0.3, and y is about 0.05. As a comparison, a second via chain having a similar structure as the first via chain is formed, wherein the barrier layers in the second via chain are formed of TaN. The measurement results are shown as hollowed circles. It is noted that the resistance of vias having TaN or $TaN_xO_y$ barrier layers have substantially the same resistance, indicating that the oxide-based barrier layer does not cause the undesired increase in resistance.

Figure 10:
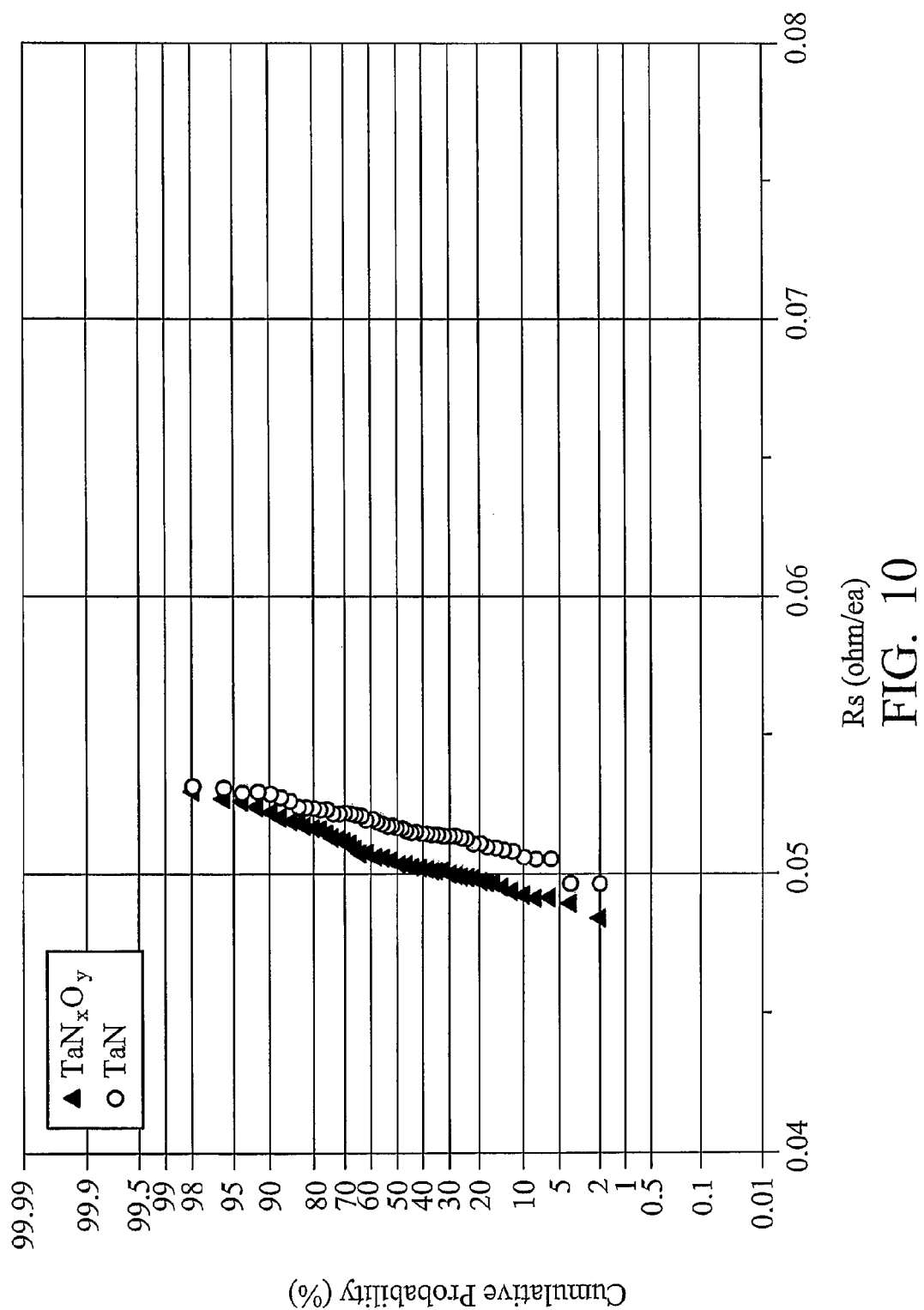
FIG. 10 illustrates the cumulative probability of metal lines having sheet resistances greater than a certain value.

FIG. 10 illustrates how an oxide-based layer adjoining a metal line affects the sheet resistance of metal lines, wherein the cumulative probability is shown as a function of sheet resistance Rs. Similarly, results obtained from metal lines having $TaN_xO_y$ in the barrier layers are shown as solid triangles, while results obtained from metal lines having TaN in the barrier layers are shown as hollow circles. The metal lines have a length of about 12,000 μm. It is noted that the sheet resistances Rs of metal lines having $TaN_xO_y$ in the barrier layers are smaller. This indicates that the preferred embodiment of the present invention has a greater effect on long metal lines.

Figure 11:
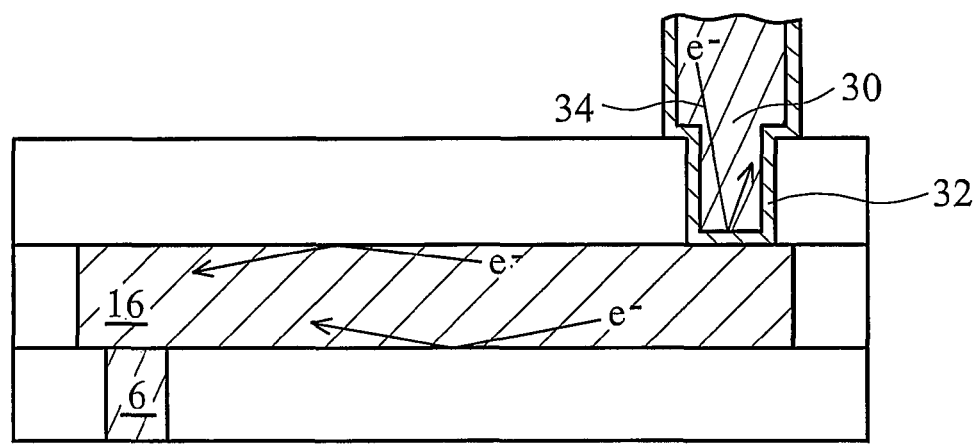
FIG. 11 illustrates the scattering behavior of electrons in a via and a metal line.

One possible reason for the greater effect on metal lines than on vias may be found in FIG. 11, which illustrates a cross-sectional view of FIG. 7 along a plane across a line A-B, although the real reason is not clear. An additional via 30 with an oxide-based barrier layer 32 is further shown on the metal line 16. As electrons flow in a long metal line 16, the elastically reflected electrons may continue to move forward with substantially no mobility loss. Vias, however, are more topographical, and even an elastic reflection can result in a loss of the mobility. For example, an electron 34 has a great mobility loss when reflected on a surface of the barrier layer 32. Therefore, less improvement in resistivity is observed on vias.

The preferred embodiment of the present invention is fully compatible with existing integrated circuit fabrication processes. Further, no additional cost is involved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming an integrated circuit structure, the method comprising:
 forming a dielectric layer;
 forming an opening in the dielectric layer;
 forming an oxide-based barrier layer on sidewalls of the opening;
 forming a copper oxide layer on the barrier layer; and
 forming conductive materials disposed in the opening, wherein the oxide-based barrier layer is between the conductive materials and the sidewalls of the opening, and the copper oxide layer is between the oxide-based barrier layer and the conductive materials.

2. The method of claim 1, wherein the oxide-based barrier layer further comprises a material selected from the group consisting of rhodium oxide, copper oxynitride, and a combination thereof.

3. The method of claim 1, wherein the oxide-based barrier layer further comprises a material selected from the group consisting of copper oxide, tantalum oxide, titanium oxide, tungsten oxide, ruthenium oxide, tantalum oxynitride, titanium oxynitride, tungsten oxynitride, ruthenium oxynitride, rhodium oxynitride, and a combination thereof.

4. The method of claim 1, wherein the oxide-based barrier layer further comprises a material selected from the group consisting of cobalt oxynitride, manganese oxynitride, and a combination thereof.

5. The method of claim 1, wherein the oxide-based barrier layer further comprises a material selected from the group consisting of cobalt oxide, manganese oxide, and a combination thereof.

6. The method of claim 1, wherein the oxide-based barrier layer is a non-copper oxide layer.

7. The method of claim 1 further comprising forming an oxide-based cap layer on the conductive materials.

8. The method of claim 1, wherein the conductive materials comprise copper.

9. The method of claim 1, wherein the oxide-based barrier layer further comprises a portion at a bottom of the opening.

10. A method for forming an integrated circuit structure, the method comprising:
 forming a dielectric layer;
 forming an opening in the dielectric layer;
 forming an oxide-based barrier layer on sidewalls of the opening, wherein the oxide-based barrier layer comprises a material selected from the group consisting essentially of cobalt oxynitride, manganese oxynitride, and combinations thereof; and
 conductive materials disposed in the opening.

11. The method of claim 10 further comprising forming a copper oxide between the conductive materials and the barrier layer.

12. The method of claim 10 further comprising forming an oxide-based cap layer on the conductive materials.

13. The method of claim 12, wherein the oxide-based cap layer comprises a same metal as in the conductive materials.

14. The method of claim 10, wherein the conductive materials comprise copper.

15. The method of claim 10, wherein the forming the oxide-based barrier layer further comprises forming a portion of the oxide-based barrier layer at a bottom of the opening.

16. A method for forming an interconnect structure, the method comprising:
 forming a dielectric layer;
 forming an oxide-based metal compound layer in the dielectric layer;
 forming a copper oxide layer on the oxide-based metal compound layer; and
 forming a copper line on the copper oxide layer and in the dielectric layer, the copper oxide layer being between the copper line and the oxide-based metal compound layer.

17. The method of claim 16 further comprising forming an oxide-based cap layer on the copper line.

18. The method of claim 16, wherein the oxide-based metal compound layer further comprises a material selected from the group consisting of rhodium oxide, copper oxynitride, and a combination thereof.

19. The method of claim 16, wherein the oxide-based metal compound layer further comprises a material selected from the group consisting of copper oxide, tantalum oxide, titanium oxide, tungsten oxide, ruthenium oxide, cobalt oxide, manganese oxide, tantalum oxynitride, titanium oxynitride, tungsten oxynitride, ruthenium oxynitride, rhodium oxynitride, and a combination thereof.

20. The method of claim 16, wherein the oxide-based metal compound layer further comprises a material selected from the group consisting of cobalt oxynitride, manganese oxynitride, and a combination thereof.

* * * * *